(12) United States Patent
Gross

(10) Patent No.: US 6,765,934 B2
(45) Date of Patent: Jul. 20, 2004

(54) LASER REPETITION RATE MULTIPLIER

(75) Inventor: Abraham Gross, Ramat-Aviv (IL)

(73) Assignee: Orbotech Ltd., Yavne (IL)

(*) Notice: Subject to any disclaimer, the term of this patent is extended or adjusted under 35 U.S.C. 154(b) by 202 days.

(21) Appl. No.: 09/855,257

(22) Filed: May 15, 2001

(65) Prior Publication Data

US 2001/0021206 A1 Sep. 13, 2001

Related U.S. Application Data

(63) Continuation of application No. 09/196,406, filed on Nov. 19, 1998, now Pat. No. 6,275,514.

(51) Int. Cl.[7] .................................................. H01S 3/10
(52) U.S. Cl. .............................. 372/25; 372/26; 372/28; 372/5; 372/18; 372/22
(58) Field of Search .............................. 372/25, 26, 28, 372/5, 18, 22

(56) References Cited

U.S. PATENT DOCUMENTS

| | | |
|---|---|---|
| 3,447,856 A | 6/1969 | Lange |
| 4,044,363 A | 8/1977 | Morgan |
| 4,180,822 A | 12/1979 | Hudson et al. |
| 4,205,348 A | 5/1980 | DeBenedictis et al. |
| 4,213,158 A | 7/1980 | DeBenedictis |

(List continued on next page.)

FOREIGN PATENT DOCUMENTS

| | | |
|---|---|---|
| EP | 0 173 617 A1 | 3/1986 |
| GB | 2 245 790 | 1/1992 |
| JP | 6-235944 | 8/1994 |
| WO | WO 94/09989 | 5/1994 |

OTHER PUBLICATIONS

Maydan, D.; "Micromachining and Image Recording on Thin Films by Laser Beams"; Bell System Technical Journal; vol. 50; No. 6; pp. 1761–1789; Jul.–Aug. 1971.

Hare, D. E. et al.; "Fundamental Mechanisms of Lithographic Printing Plate Imaging by Near–Infrared Lasers"; Journal of Imaging Sciences and Technology; vol. 41, No. 3, pp. 291–300, May–Jun.

Tison, J. K.; "Highly Accurate Pattern Generation Using Acousto–Optical Deflection"; SPIE; vol. 1463, Optical/Laser Microlithography IV, pp. 629–637, 1991.

Goldberg, L. et al.; "Deep–UV Generation by Frequency Quadrupling of a Power GaAIAs Semiconductor Laser"; Optics Letters, vol. 20, No. 10, pp. 1145–1147, May 15, 1995.

Gelbart, D.; "High Power Multi–Channel Writing Heads";IS&T's 47th Annual Conference; ICPS; pp. 608–611; 1994.

Ulrich, H. et al.; "Direct Writing Laser Lithography for Production of Microstructure"; Microelectronic Engineering 6 (1987) 77–84.

*Primary Examiner*—Leon Scott, Jr.
(74) *Attorney, Agent, or Firm*—Fenster & Company

(57) ABSTRACT

A method for recording an image on a photosensitive surface, comprising:
  producing a primary pulsed light beam;
  converting the primary light beam, in a light wavelength converter separate from the pulsed light source, to an ultraviolet pulsed light beam;
  modulating the ultraviolet pulsed beam; and
  scanning the ultraviolet pulsed light over the surface to record an image on the photosensitive surface.

13 Claims, 12 Drawing Sheets

U.S. PATENT DOCUMENTS

| | | | |
|---|---|---|---|
| 4,307,409 | A | 12/1981 | Greenig et al. |
| 4,321,564 | A | 3/1982 | Tregay |
| 4,577,932 | A | 3/1986 | Gelbart |
| 4,819,033 | A | 4/1989 | Yoshitake et al. |
| 4,883,352 | A | 11/1989 | Bruning |
| 4,912,487 | A | 3/1990 | Porter et al. |
| 4,918,462 | A | 4/1990 | Tomita et al. |
| 4,947,047 | A | 8/1990 | Muraki |
| 4,947,186 | A | 8/1990 | Calloway et al. |
| 5,041,716 | A | 8/1991 | Wakabayashi |
| 5,255,051 | A | 10/1993 | Allen |
| 5,264,872 | A | 11/1993 | Wong |
| 5,309,178 | A | 5/1994 | Gross |
| 5,311,321 | A | 5/1994 | Crowley |
| 5,327,338 | A | 7/1994 | Allen et al. |
| 5,339,737 | A | 8/1994 | Lewis et al. |
| 5,353,705 | A | 10/1994 | Lewis et al. |
| 5,377,212 | A | 12/1994 | Tatsuno et al. |
| 5,386,221 | A | 1/1995 | Allen et al. |
| 5,462,433 | A | 10/1995 | Benck et al. |
| 5,479,238 | A | 12/1995 | Whitney |
| 5,574,537 | A | 11/1996 | Ozawa |
| 5,625,403 | A | 4/1997 | Hazman et al. |
| 5,673,134 | A | 9/1997 | Oka et al. |
| 5,745,284 | A | 4/1998 | Goldberg et al. |
| 5,796,112 | A | 8/1998 | Ichie |
| 6,037,967 | A | 3/2000 | Allen et al. |
| 6,275,514 | B1 * | 8/2001 | Katzir et al. ............... 372/25 |

* cited by examiner

LASER REPETITION RATE MULTIPLIER

RELATED APPLICATIONS

This application is a continuation of U.S. patent application Ser. No. 09/196,406 filed on Nov. 19, 1998 now U.S. Pat. No. 6,275,514, which is a continuation of PCT Application PCT/IL98/00398, which designates the United States filed on Aug. 20, 1998.

FIELD OF THE INVENTION

The invention relates to repetition rate multiplication of pulsed light beams in general, and of mode locked lasers in particular. An important application of the invention is in the multiplication of the repetition rate of mode locked lasers for use in the production of printed circuit boards.

BACKGROUND OF THE INVENTION

In applications such as printed circuit board (PCB) production, a laser may be used to expose a pattern on a photoresist coating on a copper coated substrate. In a typical exposure system such as the DP 100 of LIS of Germany, a CW UV laser beam is scanned across the PCB surface, while its intensity is modulated in accordance with a pattern to be generated. The modulating device receives electronic pixel data supplied by control circuitry. In modern PCB production it is desirable to operate at high data rates to increase production speed. The practical data rate is limited by the modulation rate and/or the available laser power.

In the production of PCBs utilizing UV sensitive photoresists an Argon Ion laser is often used. Although they are widely utilized as UV light sources, Argon lasers, being gaseous lasers, have a number of drawbacks such as complicate and delicate to operate, poor maintainability and/or high price.

Methods for producing UV laser radiation are known. For example, one such method utilizes an IR mode locked laser to generate high repetition rate laser light pulses. The frequency of the laser light is doubled to UV by passing the light through a non linear medium. However, the utilization of such lasers to photoresist exposure is severely limited by an inherent paradox: practical UV power drops rapidly with an increase in the repetition rate. This is because the frequency doubling process is extremely non linear and thus, its efficiency increases with increasing peak power. For a given average IR power, peak power drops as pulse repetition rate increases, leading to reduced UV generation efficiency.

U.S. Pat. No. 5,462,433 describes a device for use in electronic warfare for delaying coherent RF signals with an adjustable time delay element. The RF signals are divided into multiple signal paths, some of the paths are delayed relative to the other paths, and then the delayed and non delayed paths are recombined to increase the pulse repetition rate.

SUMMARY OF THE INVENTION

One broad aspect of some preferred embodiments of the present invention deals with the multiplication of the pulse repetition rate of optical signals. In preferred embodiments of the invention utilizing this aspect of the invention, the average power is substantially preserved. That is, the conversion process is practically lossless.

A second broad aspect of some preferred embodiments of the invention deals with the use of amplitude modulation of a pulsed light beam to transfer information and in particular to expose a photosensitive surface. In preferred embodiments of the invention, the pulse rate of the light pulses is at least several times the frequency of the modulation. Herein, such a combination of modulation of pulsed radiation is termed "quasi-CW" modulation. Thus, one aspect of some preferred embodiments of the invention deals with using quasi-CW modulated pulsed light to expose a resist on a PC board.

Quasi-CW modulation results when the pulse repetition rate is made high enough compared with the modulation data rate, so as to minimize the timing errors resulting from the lack of synchronization between the two. The pulse repetition frequency should be at least 2–3 times the pixel data rate to assure a smooth, error free written pattern.

A third broad aspect of the invention deals with the use of a pulsed laser, synchronized in time with the data modulation and having the same repetition rate in a PCB writing system. From a practical point of view however, the requirement that the pulse rate be exactly the same as the data rate and that the pulses be individually turned on and off make such a device more difficult to implement than the quasi-CW embodiments of the invention.

The present invention is generally described in the context of repetition rate multiplication of pulsed UV lasers used in direct writing on photoresists in PCBs production. However, as it will become evident, the present invention is applicable to the repetition rate multiplication of any pulsed light beam such as chopped, coherent and/or non coherent, monochromatic and/or non-monochromatic light beams, and/or stroboscopic light. To emphasize this broader applicability of the invention, the term "pulsed light beam" (PLB) is used herein to refer to light beams other than lasers and the terms "laser beam" or "pulsed laser beam" is used when referring to pulsed lasers.

It is an object of some preferred embodiments of the present invention to provide a system and method for increasing the repetition rate of pulsed light beams. Preferably, the system will not substantially reduce the average power output of the light.

Another object of some preferred embodiments of the present invention, is to provide a laser system and a method for the use in direct writing on photoresists in the production of PCBs. Preferably, the system comprises a pulsed UV laser and a pulse rate multiplication device which multiplies the pulse repetition rate of the laser. In one aspect, some preferred embodiments of the present invention, allow for data rates higher than the laser's pulse repetition rate prior to the multiplication.

In a preferred embodiment of the invention, a laser writing system, for example, for PCBs, is provided. This system utilizes a high power pulsed laser at a relatively long wavelength and low repetition rate, for example an IR mode locked laser operating at about 80 MHz and preferably having an average power of about 1 W. The system transforms this laser light to UV, preferably using a non linear optical medium. The pulsed UV light is amplitude modulated and used to scan and expose a PCB coated with a UV sensitive resist to form a pattern. Preferably, the UV light comprises a quasi-CW train of pulses such that methods known in the art may be used to modulate the UV light and utilize it to scan the area to be exposed.

It is an object of some preferred embodiments of the present invention, to provide a repetition rate multiplication apparatus and method for use in the multiplication of the repetition rate of pulsed light beams. Preferably, the repetition rate multiplication is obtained external to a generator that produces the pulsed light beam generator. In a preferred embodiment of the invention, the pulsed light beam generator is a pulsed laser. Preferably, the pulse rate conversion process is substantially lossless such that the average power in the light beam is preserved.

Another object of some preferred embodiments of the present invention, is to provide a repetition rate multiplication method and apparatus which do not affect the PLB and/or laser beam generator initial functional specifications/ characteristics such as efficiency, resonant cavity length, heat removal scheme, etc.

Another object of some preferred embodiments of the present invention, is to provide a repetition rate multiplication apparatus which is retrofitted to an existing pulsed light source preferably, a pulsed laser.

Another object of some preferred embodiments of the present invention, is to provide a repetition rate multiplication apparatus that is composed of passive components not requiring external power for their operation. Preferably, the passive components are optical components which do not require to be mechanically displaced in order for the apparatus to be operated.

Another object of some preferred embodiments of the present invention, is to provide a repetition rate multiplication apparatus which will aim the beam pulses onto one target or simultaneously onto more than one target.

Another object of some preferred embodiments of the present invention, is to provide a repetition rate multiplication apparatus and method which allows for variable delay of individual pulses, relative to each other to impose on the pulse train a predetermined configuration.

Another object of some preferred embodiments of the present invention, is to provide a repetition rate multiplication apparatus and method which allow for the multiplication of the pulse repetition rate of a mode locked laser, preferably, without modifying the length of its resonant cavity.

There is thus provided, in accordance with a preferred embodiment of the invention, apparatus for producing high repetition rate optical pulses, including:

a beam generator that produces an initial pulsed light beam having an initial pulse repetition rate;

a pulse repetition rate multiplier, which receives the initial pulsed light beam and produces at least one pulsed light beam having a higher pulse repetition rate than the initial rate.

Preferably, the pulse repetition multiplier comprises:

a beam splitter, which receives the initial light beam and splits it into a plurality of split pulsed light beams; and at least one optical delay path, which receives the split light beams and delays the split beams by different amounts, wherein the pulsed delayed light beams taken together provide pulsed light having an increased pulse repetition rate which on the average is substantially equal to the initial rate multiplied by the plurality.

Preferably, the apparatus includes a beam combiner that receives the delayed beams and combines them into a single beam having the increased pulse repetition rate. Alternatively, the apparatus includes a beam combiner that directs the delayed beams to a given area such that the area is illuminated by light at the increased pulse repetition rate. Preferably, the beam combiner comprises a lens or more than one lens.

In a preferred embodiment of the invention, the optical delay path is comprises a beam delaying device, which includes at least one partially reflective mirror and at least one substantially fully reflective mirror.

Preferably, the optical delay path delays the split beams by an amount of time set by the distance between components of the beam delaying device.

In a preferred embodiment of the invention the apparatus includes:

a plurality of beam splitters; and at least one substantially fully reflective mirror spaced from the beam splitters.

In a preferred embodiment of the invention at least one of the beam splitters is spaced at a different distance from the at least one substantially from the fully reflective mirror Preferably, each of the beam splitters splits an incident beam into two equal portions.

In a preferred embodiment of the invention, where the plurality of beams equals N and wherein the plurality of beam splitters split an incident beam into a first beam having an intensity equal to $1/N$, $1/(N-1)$, $1/(N-2)$ ... $1/2$ times the intensity of the incident beam and a second beam having an intensity of $(N-1)/N$, $(N-2)/(N-1)$, $(N-3)/N-2)$ ... $1/2$ times the intensity of the incident beam.

In a preferred embodiment of the invention, the optical delay path comprises a polarizing cube beamsplitter and two retro-reflectors.

In a preferred embodiment of the invention, the optical delay path comprises a polarizing cube beamsplitter and two retro-reflectors and wherein the beam combiner is comprised in the polarizing cube beamsplitter.

Preferably, the initial light beam is linearly polarized.

In a preferred embodiment of the invention the apparatus includes a second repetition rate multiplier that receives an output beam from the repetition rate multiplier and produces an output beam having a repetition rate higher than the repetition rate of the beam that it receives.

Preferably, the first repetition rate multiplier and the second multiplication rate multiplier each double the repetition rate. Preferably, the second repetition rate multiplier have the structure of the repetition rate multipliers defined above.

Preferably, the increased pulse repetition rate is twice, three times, four time or even In a preferred embodiment of the invention the pulsed light beam generator generates a laser beam. Preferably, the laser beam generator comprises:

a pulsed laser operating at a first, relatively low, laser frequency;

a laser frequency doubler that doubles the laser frequency to produce the light beam.

Preferably, the pulsed laser comprises a mode locked laser. Preferably, the pulsed laser is an infra-red laser.

Preferably, the light beam is a UV laser beam.

In a preferred embodiment of the invention, the power contained in the higher repetition rate pulses is substantially equal to the initial pulsed light beam.

There is further provided, in accordance with a preferred embodiment of the invention, apparatus for transmitting information at a data rate comprising:

a pulsed light source that produces pulsed light having a pulse repetition rate, substantially higher than the data rate; and a modulator what modulates the pulsed light at the data rate.

There is further provided, in accordance with a preferred embodiment of the invention, apparatus for recording an image on a photosensitive surface, comprising:

a pulsed light source that produces pulsed light having a pulse repetition rate;

a modulator that modulates the pulsed light at a data rate; and a scanner that scans the modulated pulsed light over the surface.

Preferably, the pulsed light source is a line source and wherein the modulator spatially modulates the line.

Preferably, the photosensitive surface comprises a photoresist.

In a preferred embodiment of the invention, the data rate is substantially higher than the pulse repetition rate. Preferably, the pulse repetition rate is at least twice, three times, or four times the data rate. Alternatively, the data rate is the same as the pulse repetition rate.

Preferably, the pulsed light is laser light, preferably, comprised in a laser beam.

Preferably the pulsed light is produced in accordance with the apparatus described above.

There is further provided, in accordance with a preferred embodiment of the invention, a method for producing high repetition rate optical pulses, including:

providing an initial pulsed light beam having an initial pulse repetition rate;

multiplying the pulse rate of the initial pulsed light beam to produce at least one pulsed light beam having a higher pulse repetition rate than the initial rate.

Preferably, multiplying the pulse rate comprises:

splitting the initial light beam into a plurality of split pulsed light beams; and delaying the split light beams by different amounts, wherein the pulsed delayed light beams taken together provide pulsed light having an increased pulse repetition rate which on the average is substantially equal to the initial rate multiplied by the plurality.

Preferably the method includes combining the delayed beams into a single beam having the increased pulse repetition rate. Alternatively, the method includes combining the delayed beams and directing them to an area such that the area is illuminated by light at the increased pulse repetition rate.

In a preferred embodiment of the invention, the method includes further multiplying the pulse repetition rate of said at least one pulsed light beam having a greater rate to a an even higher repetition rate. In a preferred embodiment of the invention, multiplying and further multiplying each double the repetition rate.

Preferably, the increased pulse repetition rate is twice, three times, four times or more times the initial pulse rate.

Preferably, the pulsed light beam is a laser beam.

Preferably, the power contained in the higher repetition rate pulses is substantially equal to that contained in the initial pulsed light beam.

There is further provided, in accordance with a preferred embodiment of the invention, a method for transmitting information at a data rate comprising:

providing pulsed light that is pulsed at a pulse repetition rate, substantially higher than the data rate; and modulating the pulsed light at the data rate.

There is further provided, in accordance with a preferred embodiment of the invention, a method for recording an image on a photosensitive surface, comprising:

providing pulsed light that is pulsed at a pulse repetition rate;

modulating the pulsed light at a data rate; and scanning the modulated pulsed light over the surface.

Preferably, the pulsed light is a line of light and the modulator spatially modulates the line.

Preferably, the photosensitive surface comprises a photoresist.

In a preferred embodiment of the invention, the data rate is substantially higher than the pulse repetition rate. Preferably the pulse repetition rate is at least twice, three times or four times the data rate. Alternatively, the data rate is the same as the pulse repetition rate.

Preferably, the pulsed light is laser light, preferably, comprised in a laser beam. Preferably the pulsed light is produced in accordance with the methods described above.

DETAILED DESCRIPTION OF PREFERRED EMBODIMENTS

A way of overcoming the disadvantages of using an Argon Ion laser for exposing UV sensitive photoresists on PCBs, as described in the background section, is to start with an IR or other relatively long wavelength laser, preferably a solid state laser, and to double or otherwise convert its frequency until UV radiation is obtained. This increase in frequency is achieved by doubling the frequency of the light at least once.

IR lasers are relatively efficient and reliable, situation that facilitates the obtaining of UV laser radiation at sufficiently high powers through such pumping and frequency multiplication.

Because frequency multiplication is a nonlinear process whose efficiency increases with increasing initial laser power, UV laser radiation is obtained by harmonic generation from a high power IR or red laser such as the Tsunami mode-locked Ti:saphire laser from Spectra-Physics Lasers, pumped by laser such as the Millenia laser of Spectra-Physics. While the pulse repetition rate of the Tsunami laser may be in the same range as data rates useful in high speed writing for PCB production, the above referenced problems of pulse/data synchronization make its use problematical. Thus, in accordance with a preferred embodiment of the invention, the pulse repetition rate is further increased by systems built in accordance with preferred embodiments of the present invention. Preferably, in accordance with preferred embodiments of the invention, the repetition rate thus achieved is high enough to allow for quasi-CW modulation of the thus generated pulsed laser beam.

Preferably, the multiplication of the pulse repetition rate is achieved by a device external to the high power UV laser which does not interfere with the laser's operational conditions.

Figure 1:
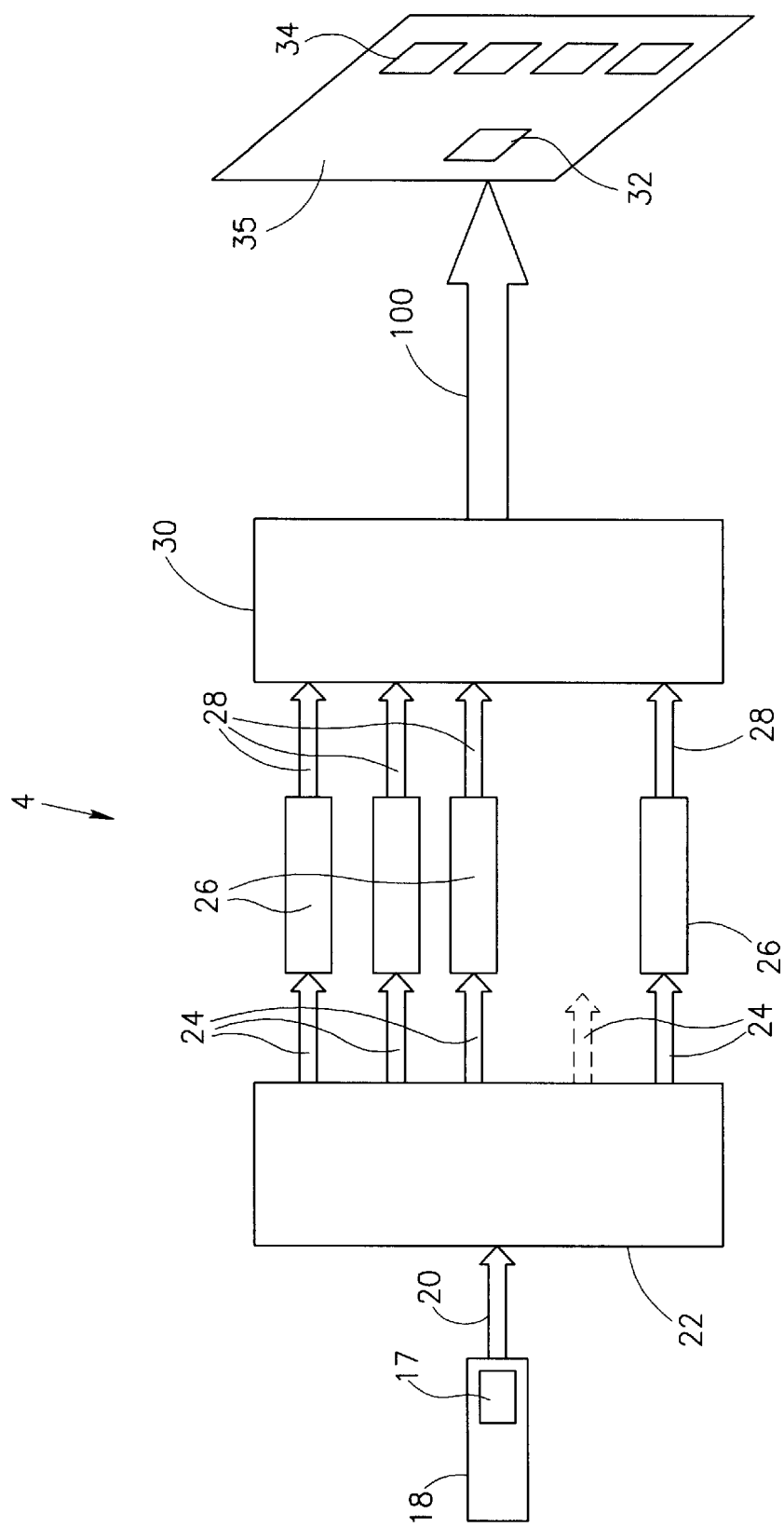
FIG. 1 is a schematic diagram showing the basic operational principle of certain preferred embodiments in accordance with the present invention.

Reference is now made to FIG. 1 which schematically depicts the basic operational principles of a preferred UV laser exposure system 4, used in direct writing on a photoresist, and built in accordance with a preferred embodiment of the present invention. A pulsed UV laser beam 20, obtained by frequency multiplication (17) of a high power pulsed laser 18, with pulse repetition rate $f_0$, enters a beam splitting device 22, which splits the initial pulsed beam into N beams 24. The N split beams are then each delayed by delay optical circuits 26, combined by beam combiner 30 to form a combined beam 100 and directed to a single target 32, or a plurality of targets 34.

When a time delay $T_n$, equal to $n\Delta t$ is imposed on each beam 24 (where n is a numbering index of the beams, from 0 to N−1) by their respective delay circuits, a series of pulses 28, separated in time by $\Delta t$ is obtained. The pulses in the series 28, are also separated in space when the optical set up shown in FIG. 1 is used. The pulse repetition rate within the total series of pulses 28, is a function of delay $T_n$ and the number of delay lines N. The only general condition these delayed beams have to satisfy is $N*\Delta t \leq 1/f_0$, where N is the number of beams 24 and $f_0$ is pulse repetition rate of laser 18. At the end of Nth pulse (a delay of $(N-1)*\Delta t$) in pulse trains 28, a subsequent pulse 20, enters beam splitting device 22 and the splitting and delaying process repeats itself. In case $N\Delta t = 1/f_0$, the Nth pulse of pulse train 28 will occur $\Delta t$ prior to the first pulse associated with a subsequent pulse 20. Delay $T_n$, may be varied or kept constant over the period $1/f_0$, as long as the condition of equation (1) is satisfied. In situations in which the final pulse repetition rate is at least 4 times the data rate, it is not necessary that the time between the Nth pulse of one series of pulses and the first pulse of the next series of pulses be equal to $\Delta t$. Furthermore, it is not necessary that the time between pulses be exactly the same, nor is it necessary that the pulses have precisely the same energy at least for writing on PCBs. Pulse train 28, enters then a beam combining device 30, wherein individual pulses 28 are combined according to a predetermined scheme.

Preferably, all the N pulses should be of substantially the same energy and equally spaced. This situation is generally preferably, since this results in a minimum fluctuation of laser power.

The following section describes the details of steps of a) splitting input beam 20 to produce split beams 24; b) delaying the split beams 24; c) combining the split beams, and d) redirecting combined beams 100, all in accordance with preferred embodiments of the present invention.

Figure 2A:
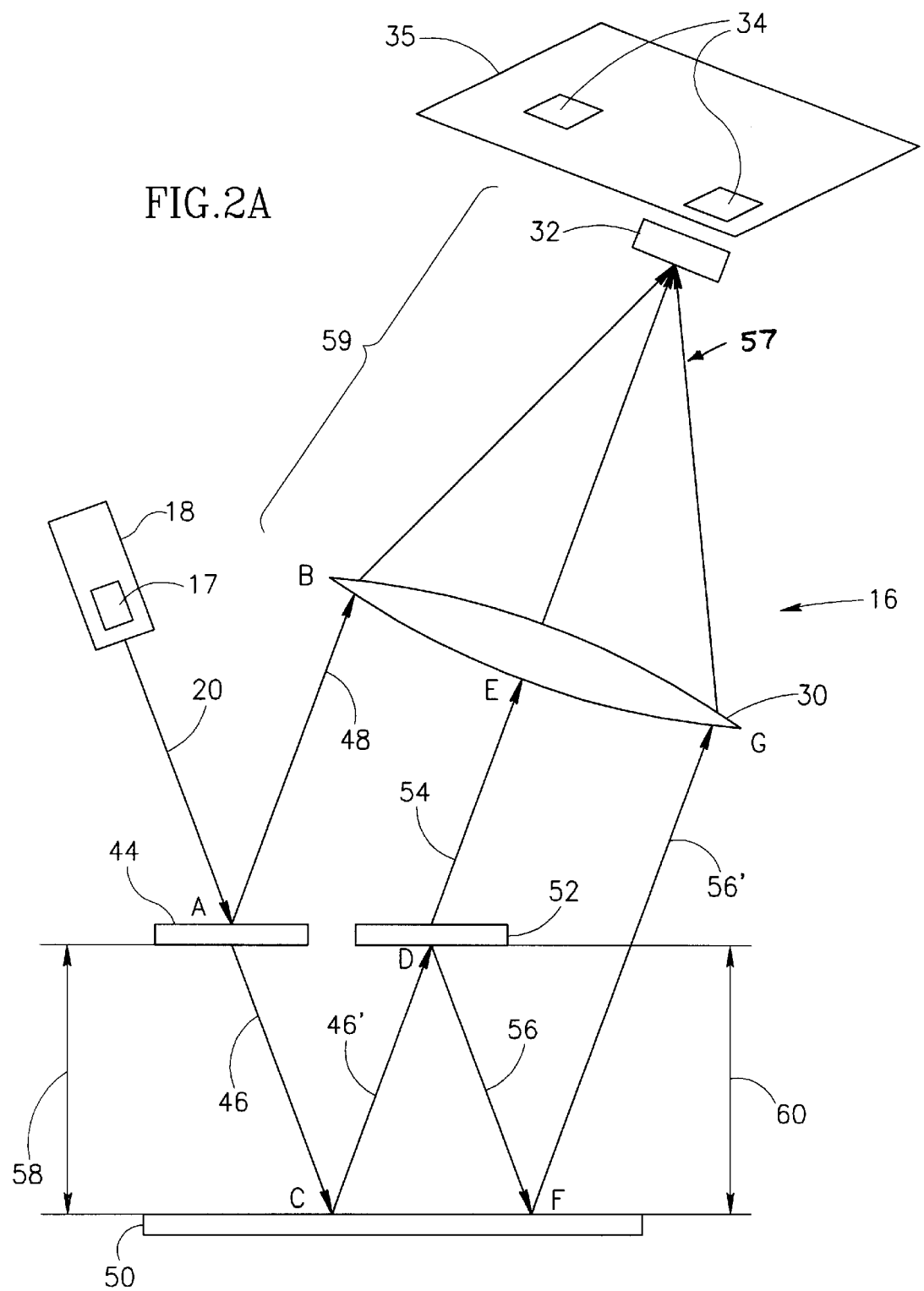
FIG. 2A is a schematic diagram showing a pulse repetition rate multiplication device in accordance with a preferred embodiment of the present invention.

Reference is now made to FIG. 2A which shows a pulse repetition rate multiplication device 16 external to a laser 18, whose frequency is multiplied by harmonic generation 17, in accordance with a preferred embodiment of the present invention. A pulsed, preferably collimated, UV laser beam 20, is made to impinge on a first partially reflective front surface mirror 44. The initial pulsed beam 20 is split into two beams, one of which is transmitted (46) and the other of which is reflected (48). Transmitted beam 46 is reflected by a 100% reflective mirror 50, towards a second partially reflective front surface mirror 52. Transmitted beam 46 is split by mirror 52 into transmitted (54) and reflected (56), beams. Reflected beam 56 is reflected again by mirror 50 in the direction of beam 56'. Beams 46 and 56 may be made to impinge on a single mirror 50 as shown in FIG. 2 or, alternatively, on two separate mirrors (not shown in FIG. 2 for the sake of clarity).

In order to obtain three pulses having equal peak power from each initial beam pulse 20, as shown in FIG. 2A, the reflectivity of mirror 44 has to be 33% and its transmission 66% while the reflectivity of mirror 52 has to be 50%. In this way beams 48, 54 and 56' will all have power $P_f = P_i/3$ where $P_f$ is the final power of each beam and $P_i$ is the initial power of beam 20. The power in each of split beams 48, 54 and 56' is thus controlled by the reflectivity of mirrors 44 and 52. This division is based on lossless mirrors. If there is some loss on the mirrors, the reflectivities are adjusted accordingly.

The embodiment shown in FIG. 2A may be extended to any desirable number N of beams of equal power by employing a series of lossless partially reflecting mirrors such as 44 and 52 having reflectivity values given by 1/N, 1/(N−1), . . . , 1/2, respectively.

Lengths AB, ACDE and ACDFG control the time delays between split beams 48, 54 and 56'. The lengths AB, ACDE and ACDFG are controlled by distances 58 and/or 60, and the angle between mirrors 44 and 50 on one hand and 50 and 52 on the other. In order to obtain three substantially equally spaced (in time) pulses out of each initial pulse 20, the lengths should be substantially ACDFG−ACDE=ACDE−AB=$(t_0/3)*c$, where c is the speed of light in the appropriate medium. It shall be obvious to persons skilled in the art that the distance will have to be modified in accordance with the thickness and refractive indices of mirrors 44 and 52.

Beams 48, 54 and 56' are preferably combined by beam combining device 30 (a lens as shown is a preferred embodiment) and directed towards modulating system 32. At the end of a cycle of "splitting-combining-redirecting" applied to a pulsed beam 20, a subsequent pulsed beam 20 reaches point A on mirror 44 and the whole beam "splitting-combining-redirecting" cycle repeats itself. Dividing pulse 20 into three pulses 48, 54 and 56' means that initial pulse repetition rate of laser 18 is tripled by the action of pulse rate multiplication device 16.

Figure 2B:
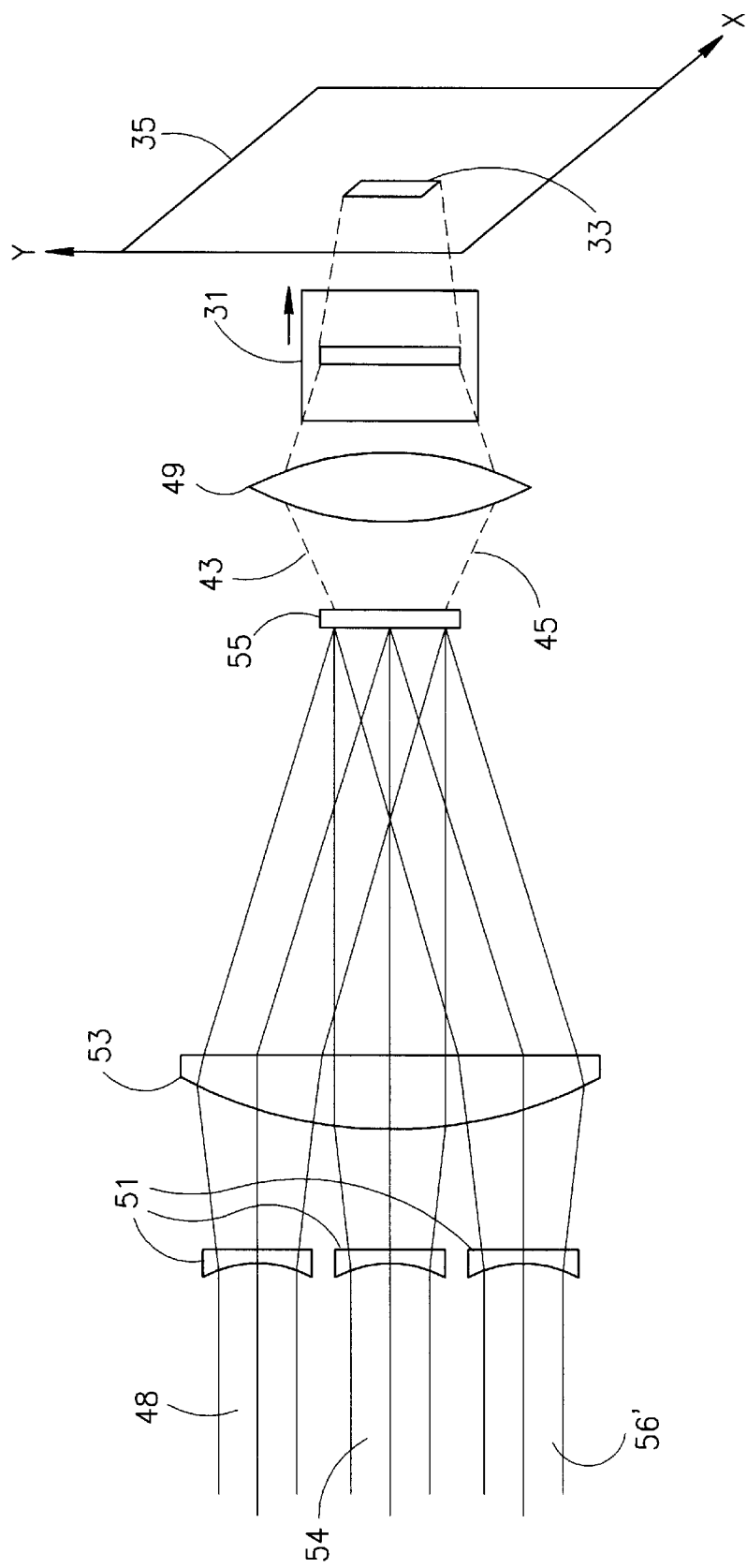
FIG. 2B shows an exemplary beam recombination setup in accordance with a preferred embodiment of the present invention.
Figure 2C:
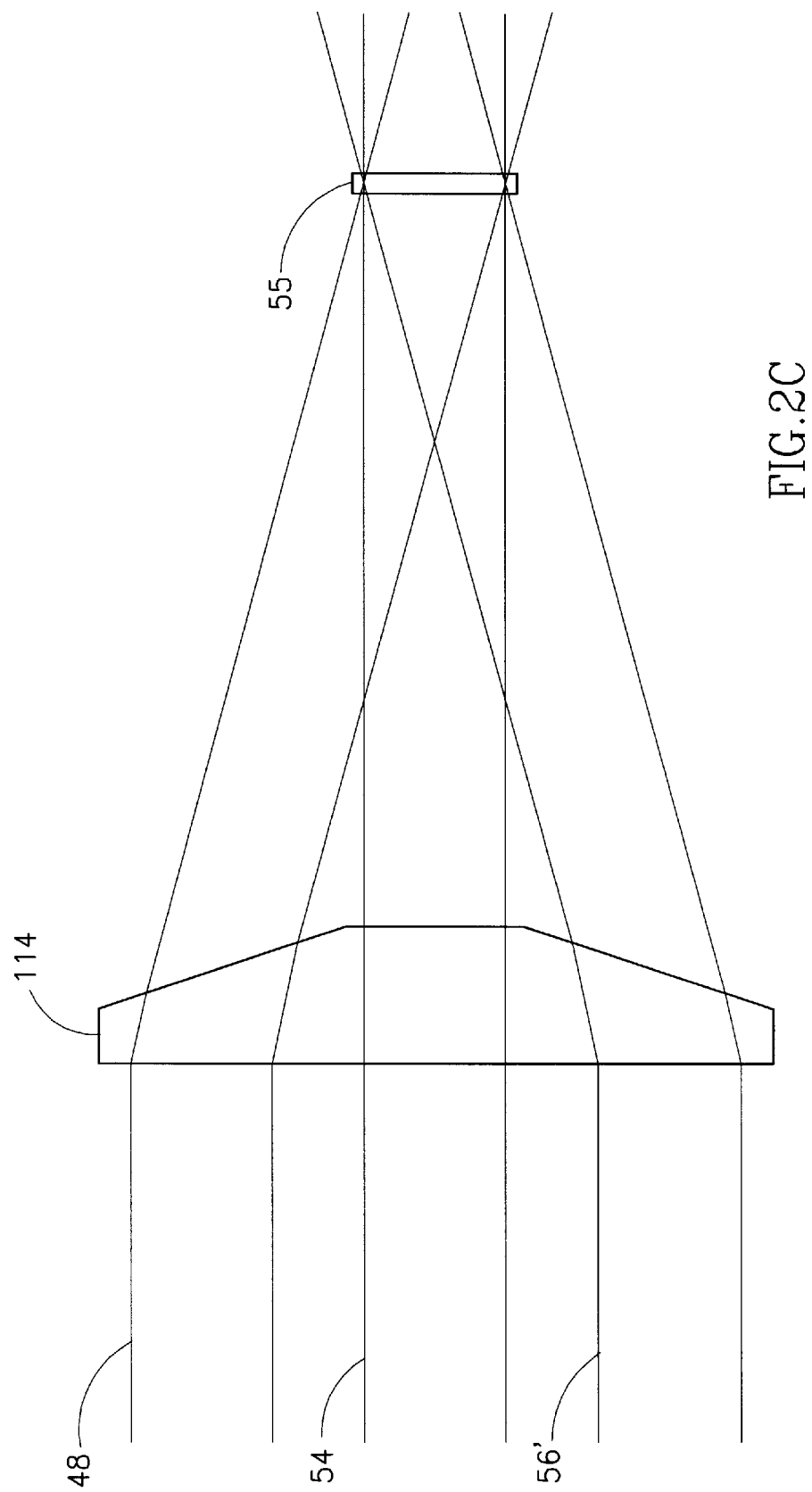
FIG. 2C shows an alternative beam recombining component in accordance with a preferred embodiment of the present invention.

Reference is now made to FIG. 2B which shows details of region 59 of FIG. 2A, in accordance with a preferred embodiment of the invention. Each individual beam 48, 54 and 56' is preferably imaged onto modulator 55, conjointly by spherical lenses 51 (negative lenses are shown, positive lenses may also be used) and cylindrical lens 53. According to this imaging scheme, each individual beam completely illuminates modulator 55 in accordance with a pattern to be generated. After being modulated by modulator 55, the beams inside boundaries 43 and 45 are imaged by lens 49, via a multi-faceted polygon mirror 31 (only one face and its direction of motion are shown), onto target 35. Polygon mirror 31 scans line 33, in the direction of X while PCB 35, moves in the direction of Y.

In some preferred embodiments of the invention, modulator 55 may be, for example, the modulator described in U.S. Pat. No. 5,309,178 to Abraham Gross. In the modulation scheme described in this patent, which is also preferable for use in the present invention, each beam is spread into a line by lens 53 and the beams are made to coincide on the input of the modulator. Preferably, lens 53 is a cylindrical lens such that the width of the lines is the same as that of beams 48, 54 and 56'. The modulator spatially modulates the line at a data rate at which the PCB is to be written. Thus, the line, which may be several tens of pixels long, writes a relatively large number of pixels on the PCB. In a preferred embodiment of the invention, each pixel is illuminated by the plurality of beams, such that the laser pulse repetition rate being modulated is the increased rate. Lens 49 is preferably large enough to receive all of the light passing through the modulator and focus it, as a line on target 35.

It will be appreciated by persons skilled in the art that the relative distances between modulator 55, lens 49 and polygon 31, in FIG. 2B are only schematic representations. In some preferred embodiments according to this invention, lenses 51 and 53 are replaced by prism 114, in FIG. 2C, which combines beams 48, 54 and 56' on modulator 55. Other methods of scanning a beam, as known in the art may also be used.

If, instead of lens 30 in FIG. 2A, three individual lenses are positioned in split beams 48, 54 and 56' the beams could be aimed towards three different targets 34. Furthermore, each beam can be spread to form a line and modulation schemes such as those known in the art may be provided to modulate individual pixels in the lines.

By varying distances 58 and 60 in FIG. 2A, variable/different time delays may be imposed on beams 54 and 56'. By varying angle between mirrors 44 and 52 on one hand and mirror 50 on the other, (see FIG. 1), the directions of beams 48, 54 and 56' may be controlled. Additionally, the diameter of input beam 20, may be optimized to fit the optics geometry. It should be understood that the angles shown are greatly exaggerated. In general the angle between the beams impinging on modulator 55 is very small.

Figure 2D:
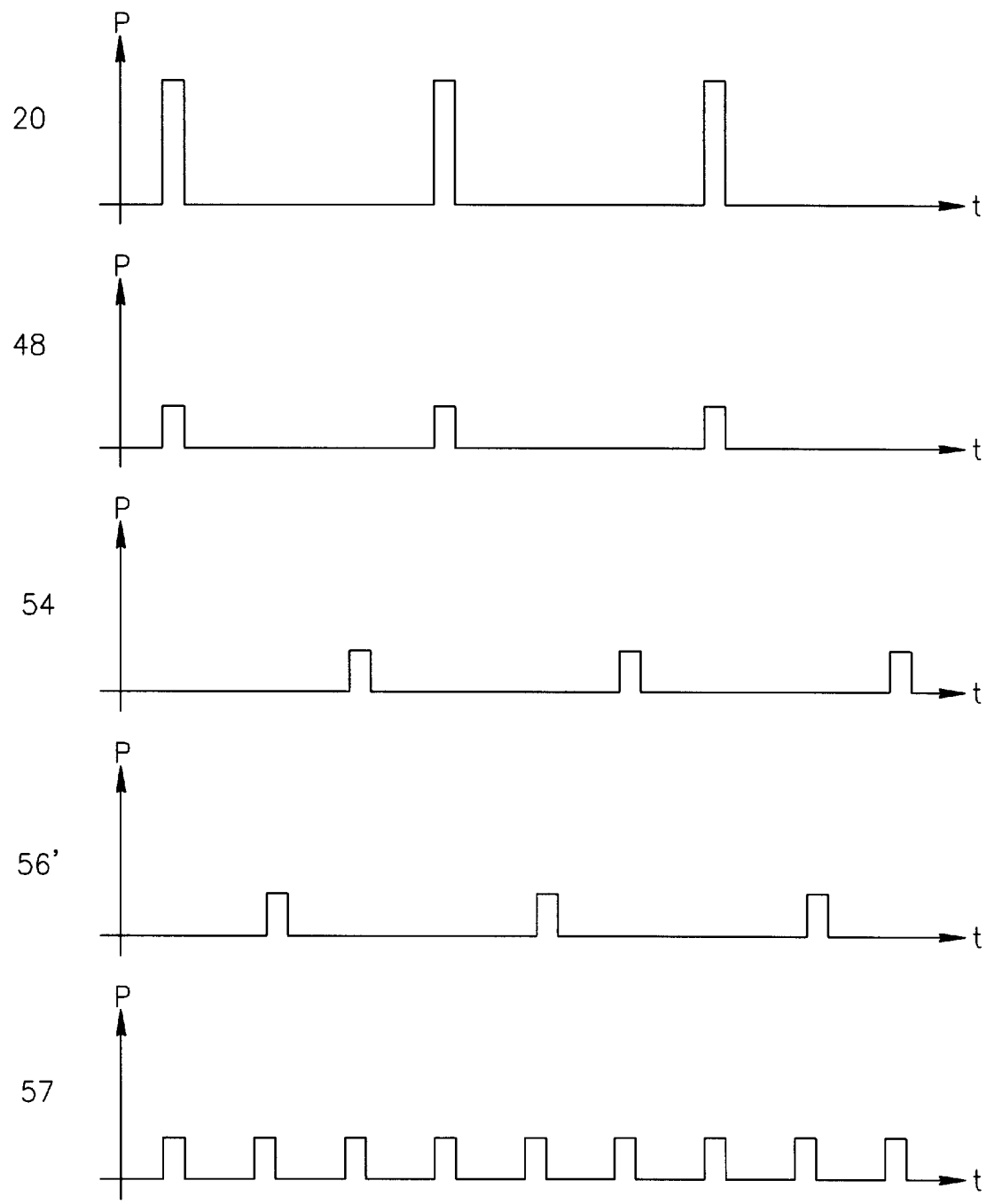
FIG. 2D shows a timing graph of input, intermediate and output beam pulses entering and exiting the pulse repetition rate multiplication device sketched in FIG. 2A.

FIG. 2D is a timing graph showing the timing of input 20, intermediate pulses 48, 54 and 56 and output pulse train, the pulse trains entering and exiting the pulse repetition rate multiplication device in accordance with FIG. 2A. Pulse train 57 has three times the pulse repetition rate and duty cycle of pulse train 20 and the same average power.

In some preferred embodiments of the present invention, mirrors 44, 50 and 52 and beam combining device 30, are integrated into a single optomechanical structure in order to obtain a stand alone pulse repetition rate multiplying apparatus. Such a stand alone unit has the possibility of being retrofitted to a pulsed laser (18 in FIG. 2A) and to serve different lasers at different times. By operating externally to laser 18, multiplication unit 16 does not perturb the proper operation of the laser. Pulse repetition rate multiplier unit 16, when used with mode-locked lasers, allows for the multiplication of the laser's original pulse repetition rate without changing its resonant cavity length or any other characteristics.

Figure 2E:
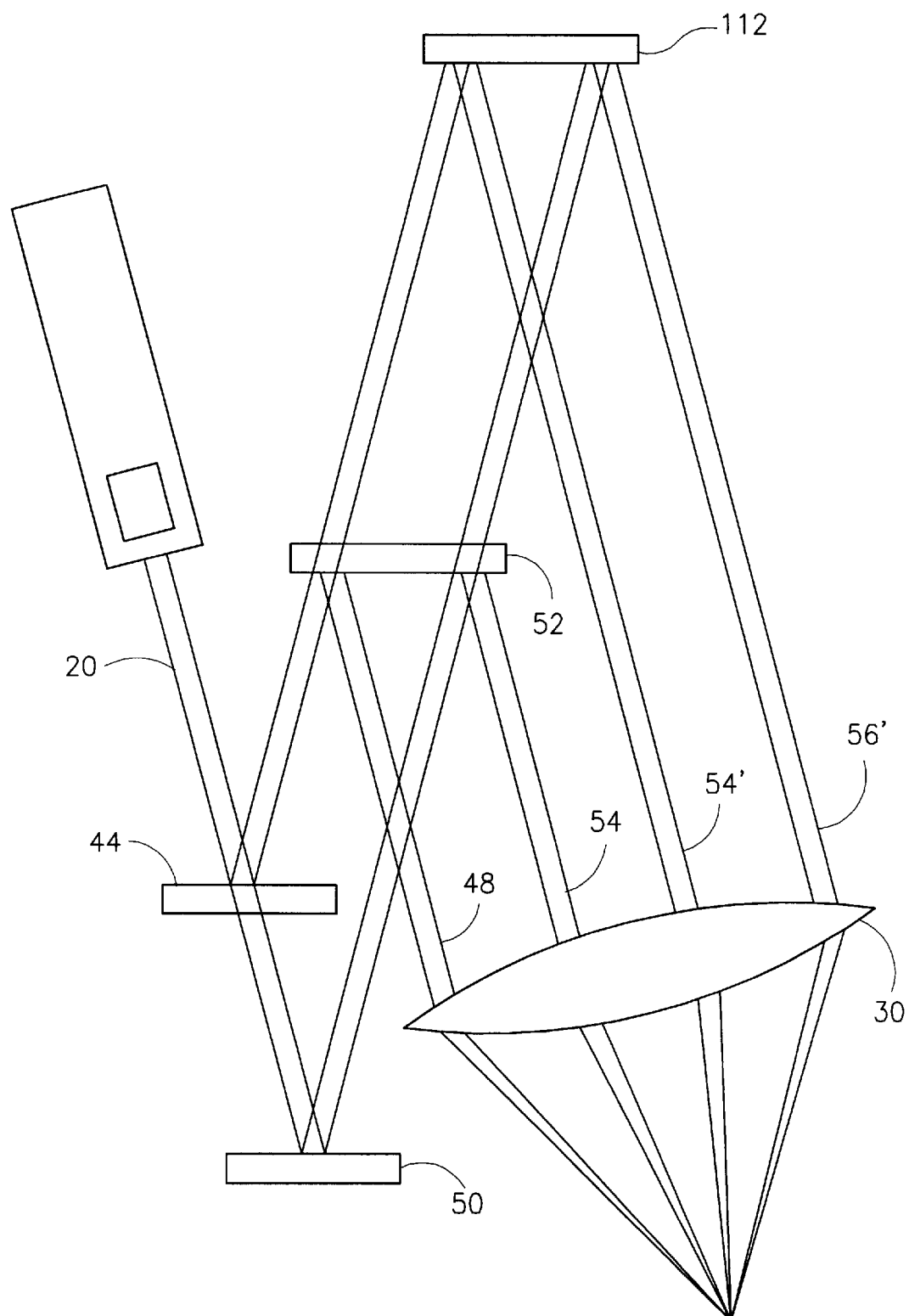
FIGS. 2E, 2F and 2G show alternative set ups for multiplying by 4 an initial pulse repetition rate of a pulsed light beam in accordance with a preferred embodiment of the present invention.
Figure 2F:
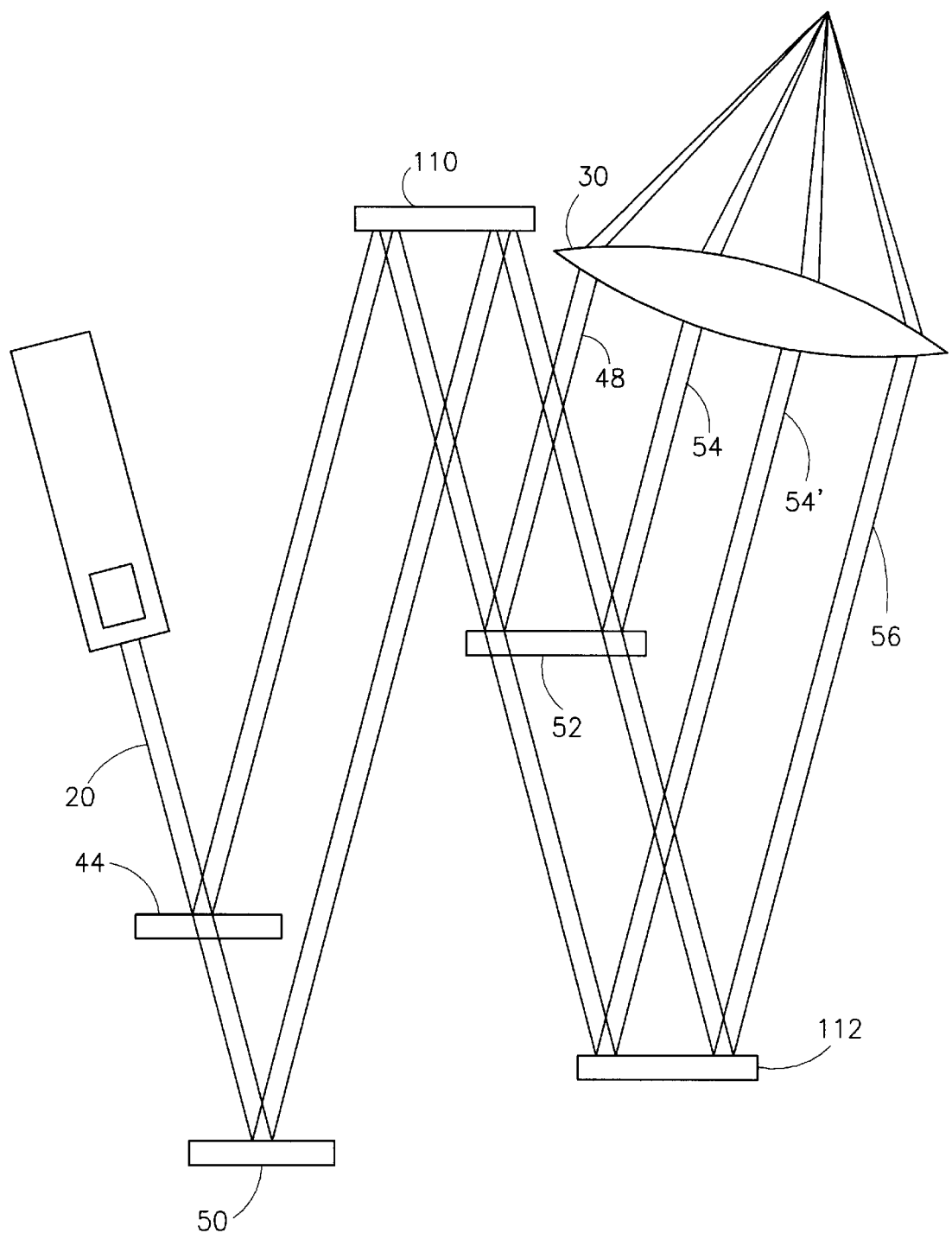

FIGS. 2E and 2F show variations of the apparatus shown in FIG. 2A. In FIGS. 2E and 2F, initial beam 20, is split into four (instead of three as in FIG. 2A) beams 48, 54, 54' and 56'. This is achieved using only two types of mirrors. Mirrors 44 and 52 are preferably partially reflective front surface mirrors while mirrors 50, 110 and 112 are 100% reflectors. If the distance between mirrors 52 and 112 is 1.5 times the distance between mirrors 44 and 50 and the reflectivity and transmission of mirrors 44 and 52 are both 50% and the reflectivity of mirrors 50, 110 and 112 is 100%, beams 48, 54, 54' and 56' have pulse that are equally spaced in time and of equal power.

Figure 2G:
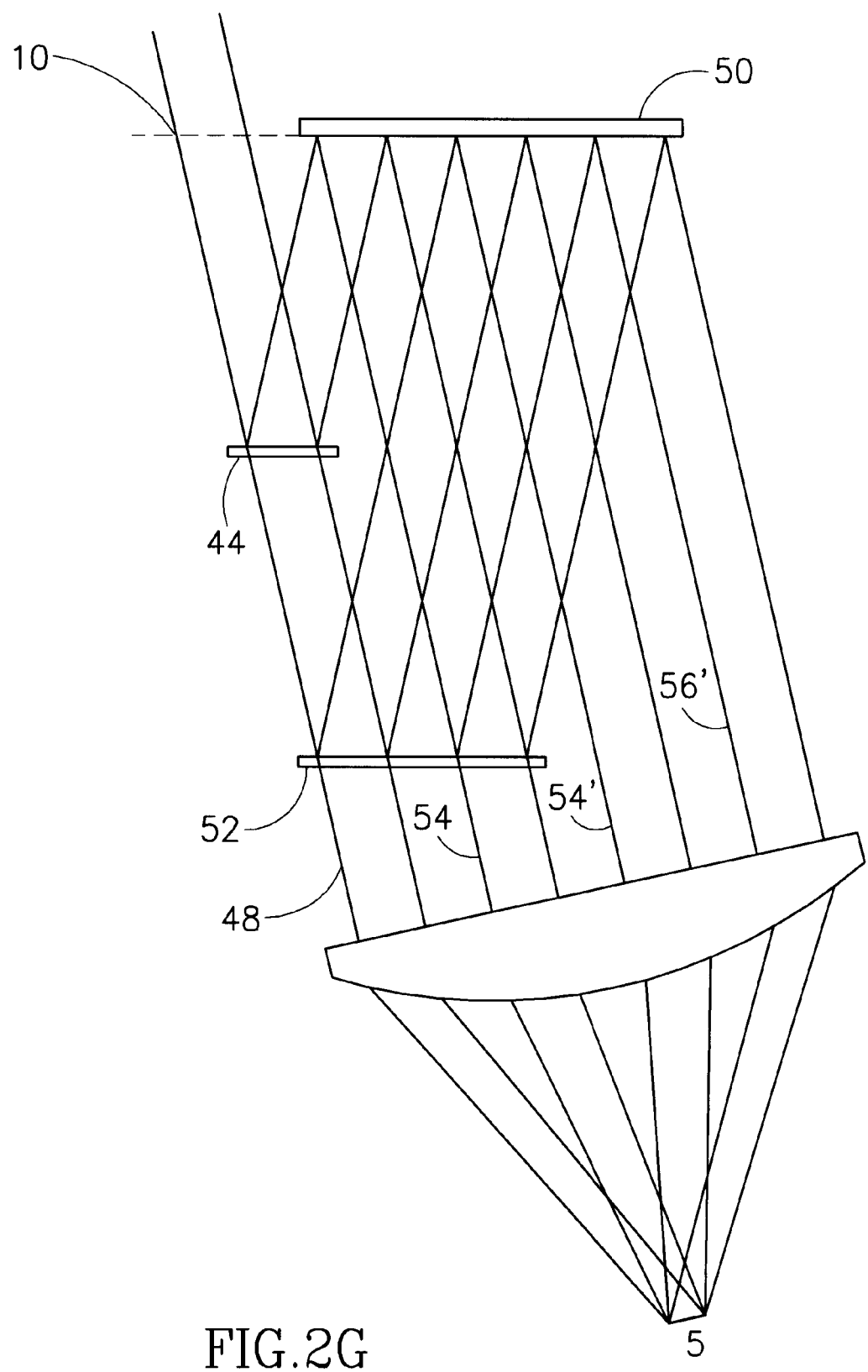

FIG. 2G shows another possible setup for splitting an initial pulsed beam 20 into four beams 48, 54, 54' and 56, by lossless mirrors 44 (50% reflective), 52 (50% reflective) and 50 (100% reflective). If the distance between mirrors 50 and 52 in the setup of FIG. 2G is H and mirror 44 is placed exactly halfway between mirrors 52 and 54', the beams are delayed relative to each other as follows: $delay_{(48-54')}=H/c$; $delay_{(48-54)}=2H/c$ and $delay_{(48'-56')}=3H/c$ where c is the speed of light and c/4H is the initial pulse repetition rate of pulsed beam 20.

Figure 3A:
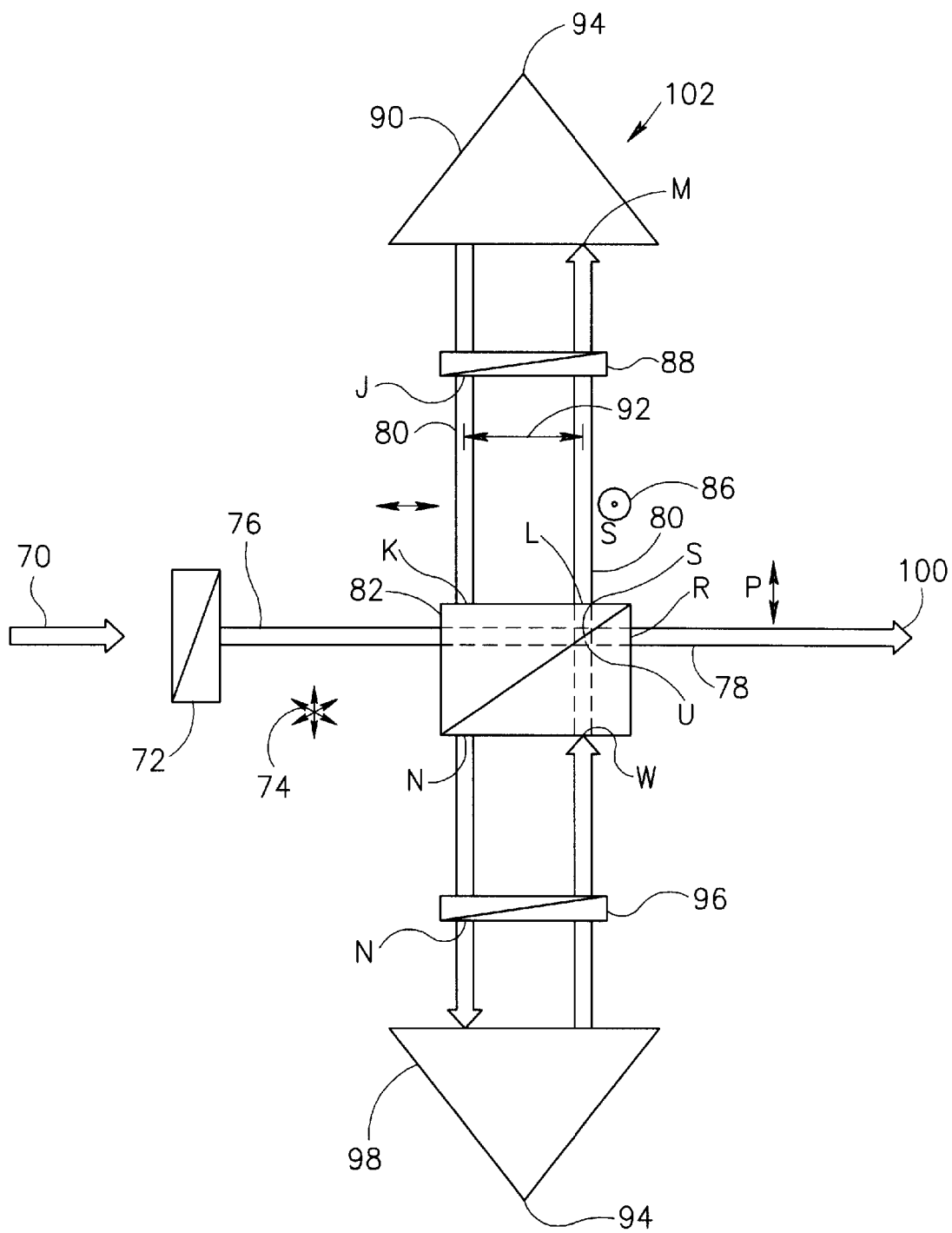
FIG. 3A is a schematic diagram showing a pulse repetition rate multiplication device which operates with a polarized input beam pulse in accordance with a preferred embodiment of the present invention.

Another preferred embodiment of the present invention is shown in FIG. 3A. An initially linearly polarized, preferably collimated, pulsed laser beam 70, is passed through a quarter wave retardation plate 72, such as the Q2 WRQ quartz retardation plates of Melles Griot. Quarter wave retardation plate 72 transforms the initial linearly polarized beam into circularly polarized beam 76. Circularly polarized beam 76, is split into two mutually orthogonal, polarized beams, by a polarizing cube beamsplitter 82, such as the O3 PBB broadband Polarizing Cube Beamsplitter of Melles Griot.

These beams, have p and s polarizations and are referenced by reference numbers 78 and 80 respectively. Beam 78, which passed through the polarizing cube beamsplitter, has its polarization vector oriented parallel, 84, to the plane of the figure while beam 80 has its polarization vector oriented perpendicular 86, to the plane of the figure. As a consequence, it is reflected by polarizing cube 82.

After exiting polarizing cube 82, at a location L, beam 80 is passed through a first quarter wave plate 88, back reflected by a first retro-reflector 90 such as the TECH SPECH retro-reflectors of Edmund Scientific and then passed again through first quarter wave plate 88 in the opposite direction. Thus, the second time it exits first quarter wave plate 88 at location J, beam 80 has its polarization vector 93, oriented parallel to the plane of the figure. Beam 80 enters again polarizing cube beamsplitter 82 at a location K and passes through it because of the new orientation of its polarization vector.

A separation 92, between beam 80 exiting polarizing cube beamsplitter 82 at location L and entering the same cube at location K, is determined by a lateral distance between an apex 94 of retro-reflector 90 and a location M where beam 80 enters retro-reflector 90. This distance, in turn, is determined by the geometrical dimensions of retro-reflector 90 and its positioning relative to cube beamsplitter 82. The larger the lateral distance between apex 94 and location M, the greater the distance between beams 80 exiting and re-entering polarizing cube beamsplitter 82.

Beam 80, exiting cube beamsplitter 82 at location N, passes through a second quarter wave plate 96. Beam 80 is then back reflected by a second retro-reflector 98 and passes through quarter wave plate 96 again. When entering again cube beamsplitter 82, beam 80 has its polarization vector oriented perpendicular to the plane of the figure. Thus this time, beam 80, is reflected by cube beamsplitter 82.

In a preferred embodiment of the present invention, output beam 100, is made up of delayed (80) and non delayed (78), beams having crossed polarization.

Furthermore, beam 80 exiting the cube beamsplitter at location R is delayed, relative to beam 78, by an amount of time Δt equal to the time it takes beam 80 to complete a round trip from a location S to a location U in cube beamsplitter 82. By varying the distance between cube beamsplitter 82 and first and/or second retro-reflectors 90 and 98, the time delay Δt, between pulsed beams 78 and 80 at location R, can be varied.

In a preferred embodiment of the present invention as depicted in FIG. 3A, a single laser pulse 70 is divided into two pulses 78 and 80 and combined at location U of cube beamsplitter 82. The two pulses have the same pulse widths as the initial pulse. Subsequent pulses 70 will undergo the same "splitting-delaying-recombining" process, such that device 102 shown in FIG. 3A, acts as a pulse repetition rate doubler. Recall that the first device described above and depicted in FIG. 2A acted as a pulse repetition rate multiplier having any multiplication factor. An advantage of pulse repetition rate doubler 102, in FIG. 3A is that output beam 100 retains substantially the same spatial and angular properties of input beam 70.

Figure 3B:
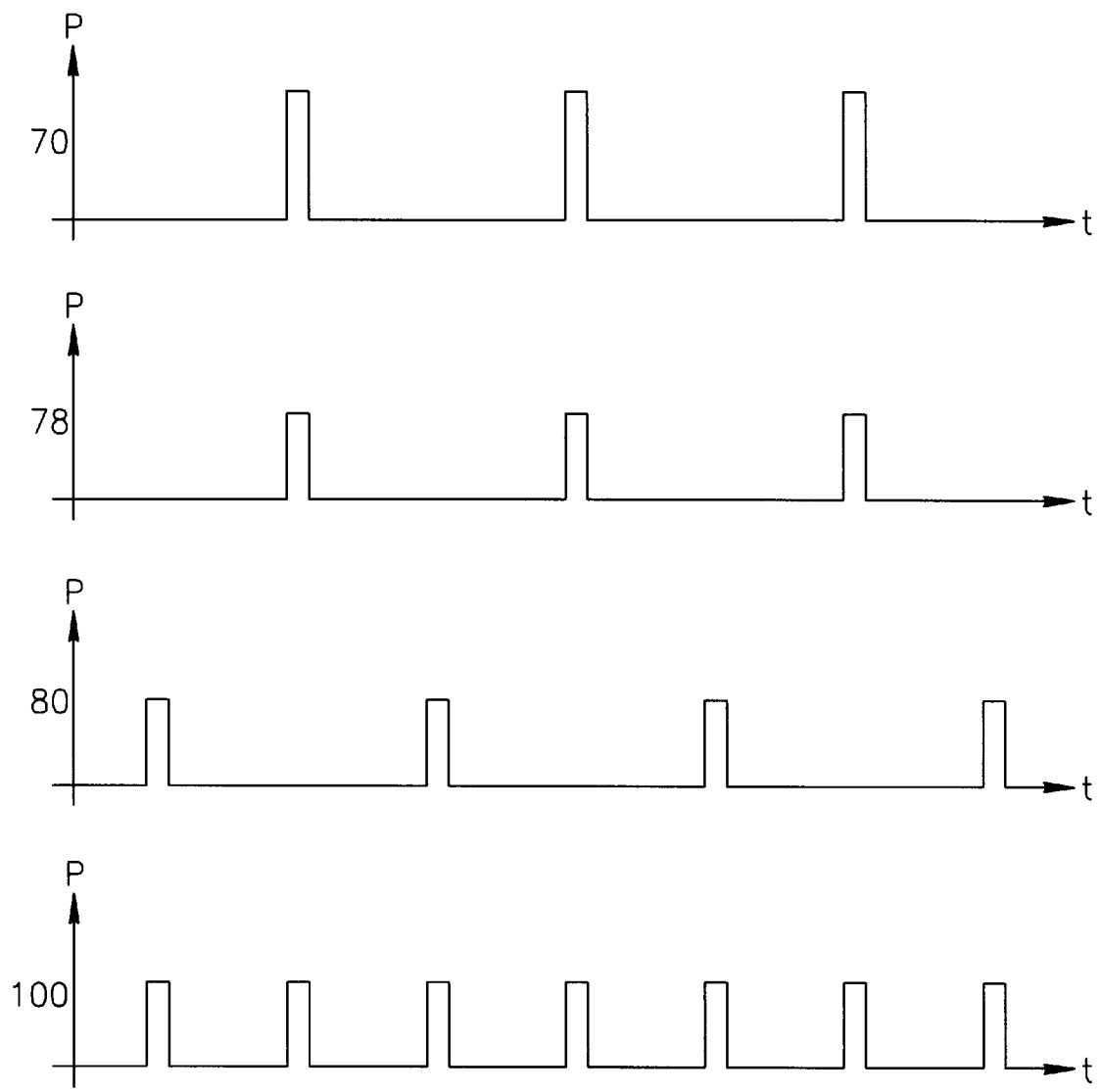
FIG. 3B shows a timing graph of input, intermediate and output beam pulses entering and exiting the pulse repetition rate multiplication device sketched in FIG. 3A.

FIG. 3B is a timing graph showing the timing of input 70, intermediate beams 78 and 80, and output beam 100, beam pulses entering and exiting the pulse repetition rate doubler device sketched in FIG. 3A. Input beam 70 has twice the peak power of each of beams 78, 80 and 100. Beam 80 is delayed relative to beam 78. Beam 100 has twice the pulse repetition rate as beams 70, 78 and 80 and twice the duty cycle. Pulse widths are equal in beams 70, 78, 80 and 100. Beam 100 has substantially the same average power as beam 70.

Repetition rate multiplying device 102 also may be integrated in a single optomechanical device in order to obtain a stand alone pulse repetition rate doubling apparatus with the same structural and operational characteristics, except for the final repetition rate, as the pulse repetition rate multiplier described above with reference to FIG. 2A.

Alternatively or additionally, more than one device 102 may be used in cascade in order to obtain 4 times, 8 times, or greater multiplication of the initial pulse repetition rate. For example, we can make output beam 100, made up of beams 78 and 80, enter a second device similar to device 102. In the second device, wave plate 72 is oriented at an angle relative to beam 100 so that beams 78 and 80, with cross polarization, will both be transformed into circularly polarized beams. In the second device, distances between polarizing cube beamsplitter 82 and retro-reflectors 90 and 98 will have to be for example, somewhat less than half the corresponding distances in first device 102 in order to obtain equally separated (in time) final pulses (taking into account the optical path in the retro-reflector). It should be understood that the input quarter wave plates 72 for all doublers must be at a 45 degree angle to the polarization of the input beam 70. Thus, since the output 100 comprises two beams (P and S) which are orthogonally polarized, the input quarter wave plate for second and subsequent doublers must be placed at a 45 degree angle with respect to both P and S of the previous stage.

Figure 4:
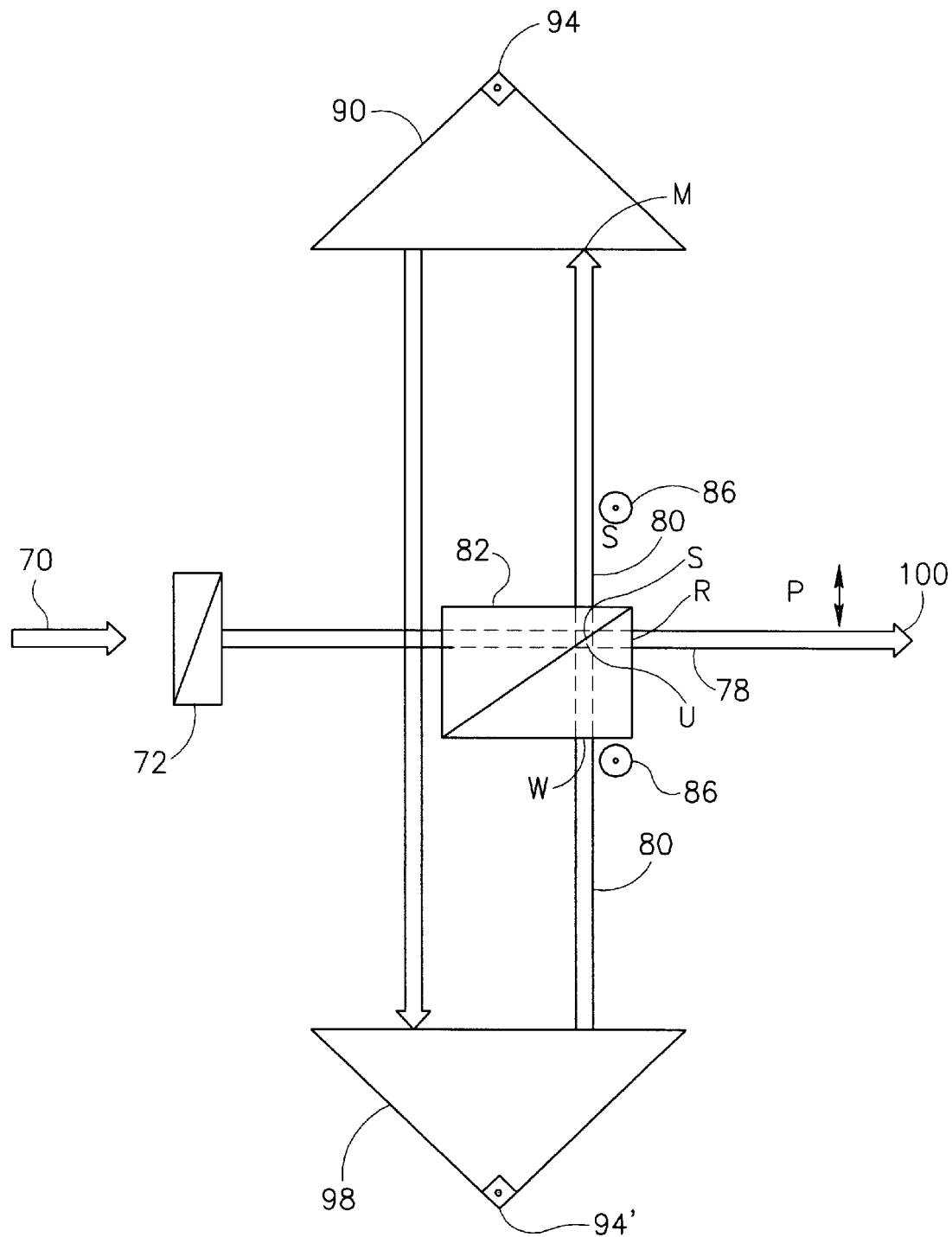
FIG. 4 shows an alternative configuration of a pulse repetition rate multiplication device which operates with a polarized input beam pulse, in accordance with a preferred embodiment of the present invention.

An alternative preferred configuration to that shown in FIG. 3A, is schematically depicted in FIG. 4. Comparing FIGS. 3A and 4, one sees that the devices sketched in both figures operate according to the same principle. In both a linearly polarized pulsed laser beam is turned into a circularly polarized beam and then split and recombined by a single polarizing cube beamsplitter.

In the configuration of FIG. 4, physical dimensions and/or positioning of retro-reflectors 90, 98 and/or cube beamsplitter 82 are such as to force beam 80, as back-reflected by retro-reflector 90, to miss polarizing cube beamsplitter 82, while beam 80 back-reflected by second retro-reflector 98 enters the beamsplitter, which combines it with beam 78. Because beam 80 misses beamsplitter 82, quarter wave plates 88 and 96 of FIG. 3A are not necessary and thus, removed from configuration of FIG. 4.

The time graph of input, intermediary and output beams in configuration of FIG. 4 are the same as shown in FIG. 3B. Here also the delay between beams 78 and 80 is controlled by the distance of polarizing cube beamsplitter 82 and retro-reflectors 90 and 98 as well as by their geometrical dimensions.

In some preferred embodiments of the present invention such as those sketched in FIGS. 3A and 4, delayed and non delayed beams 80 and 78 are combined and then extracted as a single output pulsed beam 100. This beam may be spread to provide line illumination that is modulated, pixel by pixel, by means well known in the art, such as the Gross patent referenced above. Whether beams 78 and 80 will be combined in a single output beam 100 or will be extracted as two different beams depends on a location W on polarizing cube beamsplitter, to which delayed beam 80 is directed from second retro-reflector 98. If beam 80 is made to coincide with beam 78 at location U in cube beamsplitter 82, the two beams will be combined in a single output beam 100. Otherwise the two beams will be separately extracted from beamsplitter 82.

While the use of a single polarizing cube beamsplitter 82 in FIGS. 3A and 4, limits the multiplication of the initial pulse repetition rate by two, the use of multiple beamsplitters 44 and 52 in FIG. 2A, allows the multiplication factor to be higher than two. The output beams extracted from repetition rate multipliers as shown in FIGS. 3A and/or 4 are preferably collinear while in the multiplier shown in FIG. 2A the output beams are generally not collinear.

The pulse repetition rate multiplying devices described above with reference to preferred embodiments in accordance with this invention, all retain the average power of the UV laser beam entering the device, the individual pulsed beam power and/or the relative delay between single pulses being less important in direct writing on photoresists in PCBs production.

Figure 5:
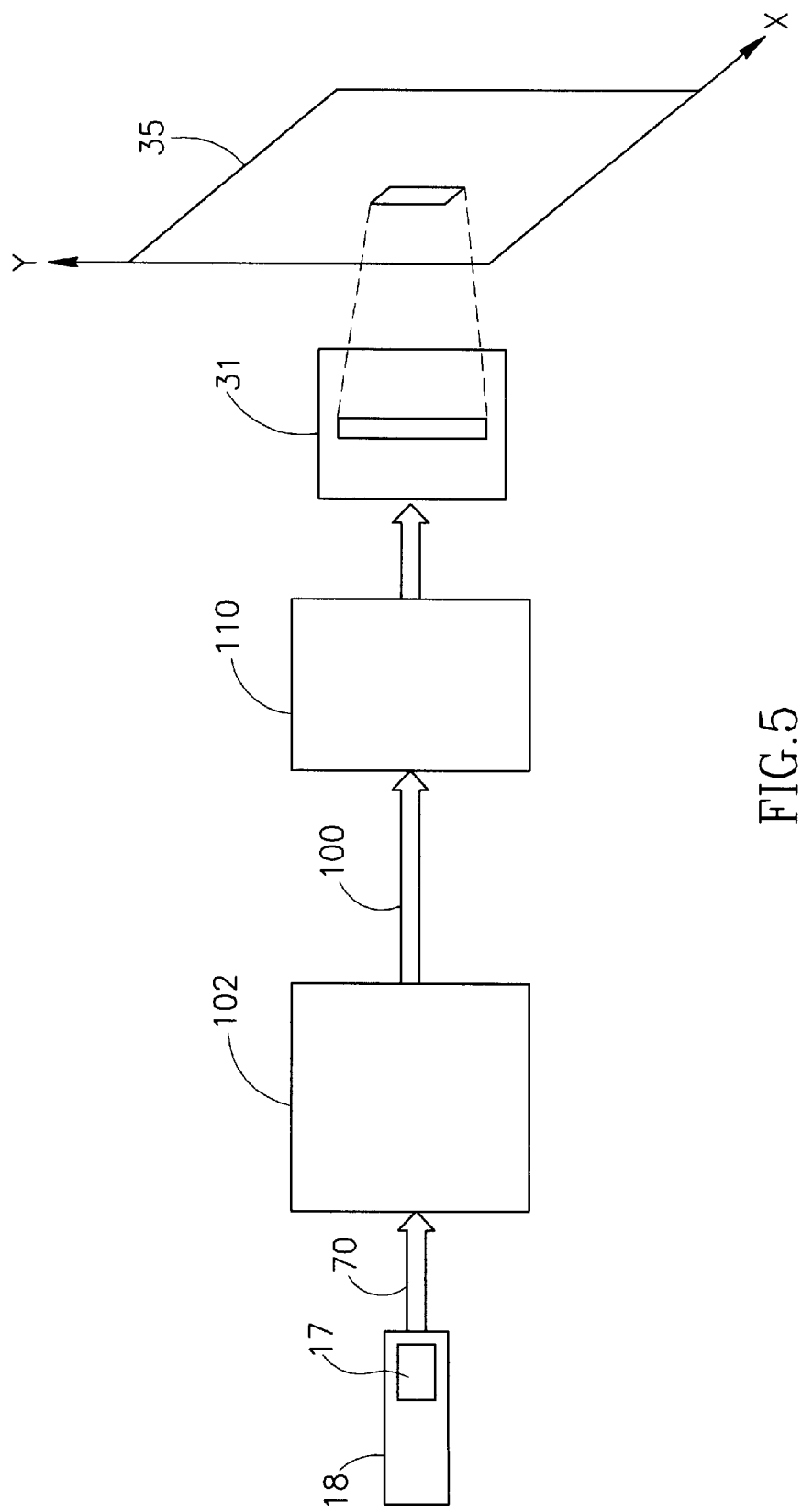
FIG. 5 is a schematic diagram showing the way some preferred embodiments of the present invention are integrated in a PCB production line.

Reference is now made to FIG. 5 which is a schematic diagram showing how preferred embodiments of the present invention are integrated in a PCB production line. Linearly polarized and pulsed UV laser beam 70 is preferably obtained by harmonic generation 17 from a high power mode-locked IR laser. For example a Millennia laser, of Spectra Physics Lasers, at 532 nm wavelength pumps a Tsunami mode-locked Ti:saphire laser from Spectra-Physics Lasers. The output beam of the Tsunami mode-locked Ti:saphire laser is frequency doubled to about 390 nm. Preferably, the repetition rate of the IR laser is 82 MHz and its wavelength is around 780 nm. The pulse repetition rate of UV beam 70 is multiplied (e.g. 2×, 4×, etc.) by one of the devices 102, as described above. Output beam 100 exiting from device 102 impinges on an optical writing device 110, and is scanned across the surface of a photoresist 35, used in the production of PCBs, by the joint action of a polygon mirror 31, in the direction of X and the lateral displacement of the PCB 35, in the direction of Y. Preferably, the beam is modulated by methods described in U.S. Pat. No. 5,625,403 to Hazman and/or in U.S. Pat. No. 5,309,178 to Gross, the disclosures of which are both incorporated by reference.

Thus, in preferred embodiments of the invention the pulse repetition rate may vary between 160 MHz (for repetition rate doubling) and 320 MHz for repetition rate quadrupling or more for greater multiplication. This allows for data rates of well over 100 MHz for each pixel of the line being modulated.

It will be clear to any person skilled in the art, that the scope of the present invention is not limited to the arrangements above described and sketched in FIGS. 2A, 3A and 4 nor to pulsed UV laser beams. Devices operating on basic principles according to preferred embodiments of the present invention may multiply the pulse repetition rate of any pulsed light beam; not only of pulsed lasers and not only of UV lasers.

Furthermore, the aspect of the invention that utilizes a quasi-CW modulation scheme as described above need not operate at UV and certainly need not utilize a frequency doubled laser. In a broad aspect of the invention, any use may be made of such quasi-CW modulated light, as for example scanning a surface or data transmission.

Furthermore, the present invention has been described using non-limiting detailed descriptions of preferred embodiments thereof that are provided by way of example and that are not intended to limit the scope of the invention. Variations of embodiments of the invention, including combinations of features from the various embodiments will occur to persons of the art. The scope of the invention is thus limited only by the scope of the claims. Furthermore, to avoid any question regarding the scope of the claims, where the terms "comprise," "comprising," "include," "including" or the like are used in the claims, they mean "including but not necessarily limited to".

What is claimed is:

1. Apparatus for recording an image on a photosensitive surface, comprising:
    a pulsed light source that produces a primary pulsed light beam;
    a light wavelength converter, separate from the pulsed light source, that receives the primary pulsed light beam, and produces a second, ultraviolet pulsed light beam responsive thereto;
    a modulator that modulates the ultraviolet pulsed light beam; and
    a scanner that scans the modulated ultraviolet pulsed light over the surface to record an image on the photosensitive surface.

2. Apparatus according to claim 1 wherein the pulsed light source is a laser source.

3. Apparatus according to claim 1 wherein the pulsed laser comprises a mode locked laser.

4. Apparatus according to claim 1 wherein the primary light beam is an IR light beam.

5. Apparatus according to claim 1 wherein the primary light beam is a red light beam.

6. Apparatus according to claim 1 wherein the modulator includes a data input for data wherein the modulator modulates the ultraviolet pulsed light responsive to data input to the modulator.

7. A method for recording an image on a photosensitive surface, comprising:
    producing a primary pulsed light beam;
    converting the primary light beam, in a light wavelength converter separate from the pulsed light source, to an ultraviolet pulsed light beam;
    modulating the ultraviolet pulsed beam; and
    scanning the ultraviolet pulsed light over the surface to record an image on the photosensitive surface.

8. A method according to claim 7 wherein the primary pulsed light beam is a laser beam.

9. A method according to claim 7 wherein producing the primary pulsed light beam comprises producing the primary pulsed light beam utilizing a mode locked laser.

10. A method according to claim 7 wherein the primary pulsed light beam is an IR laser beam.

11. A method according to claim 7 wherein the primary pulsed light beam is a red laser beam.

12. A method according to claim 7 wherein modulating comprises, modulating the ultraviolet pulsed beam at a data rate.

13. A method according to claim 12 wherein the pulsed light has a pulse repetition rate and wherein the data rate is lower than the pulse repetition rate.

* * * * *